(12) United States Patent
Yang (10) Patent No.: US 7,183,731 B2
(45) Date of Patent: Feb. 27, 2007

(54) PULSE GENERATING METHOD AND PULSE GENERATOR, AND MOTOR CONTROL SYSTEM USING THE SAME

(75) Inventor: In-su Yang, Bundang-gu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 29 days.

(21) Appl. No.: 10/965,975

(22) Filed: Oct. 18, 2004

(65) Prior Publication Data
US 2005/0258787 A1   Nov. 24, 2005

(30) Foreign Application Priority Data
May 18, 2004  (KR) ............... 10-2004-0035161

(51) Int. Cl.
*H02K 21/00* (2006.01)
*H02K 23/00* (2006.01)
*H02K 31/00* (2006.01)
*H02P 1/18* (2006.01)
*H02P 3/08* (2006.01)

(52) U.S. Cl. ............... 318/254; 318/601; 318/603; 388/907; 388/912; 388/921

(58) Field of Classification Search ............... 318/599, 318/600, 601, 603, 636, 811
See application file for complete search history.

(56) References Cited

U.S. PATENT DOCUMENTS

| | | | |
|---|---|---|---|
| 3,612,974 A | 10/1971 | Wolf | |
| 3,836,756 A * | 9/1974 | Yammoto et al. | 318/602 |
| 3,869,019 A | 3/1975 | Cardani | |
| 4,270,868 A * | 6/1981 | Morgan et al. | 400/320 |
| 4,429,268 A | 1/1984 | Yajima | |
| 5,936,371 A | 8/1999 | Bolash | |

(Continued)

FOREIGN PATENT DOCUMENTS

| | | |
|---|---|---|
| JP | 1-298976 | 12/1989 |
| KR | 1994-5977 | 6/1993 |
| KR | 10-0287427 | 1/2000 |
| KR | 10-0300131 | 6/2001 |
| KR | 2004-4831 | 1/2004 |

*Primary Examiner*—Lincoln Donovan
*Assistant Examiner*—Erick Glass
(74) *Attorney, Agent, or Firm*—Stanzione & Kim, LLP (57) ABSTRACT

A method of generating pulses includes setting a cycle based on a frequency of reference clock, determining a total number of the pulses to be generated during the cycle, calculating the number of one or more first reference clocks used to determine a width of one or more first pulses, the number of one or more second reference clocks used to determine a width of one or more second pulses, a first pulse number for the first pulses and a second pulse number for the second pulses on the basis of the cycle and the total number of the pulses, and generating the first pulse number of the first pulse and the second pulse number of the second pulses during the cycle. A motor control system employs the above pulse generating method and a pulse generator using the method to improve accuracy of controllability of a motor by generating the total number of the pulses during a cycle, and decrease a manufacturing cost.

31 Claims, 7 Drawing Sheets

U.S. PATENT DOCUMENTS

| | | | | |
|---|---|---|---|---|
| 6,121,747 A | * | 9/2000 | Trachtenberg | 318/800 |
| 6,324,085 B2 | * | 11/2001 | Kimura et al. | 363/132 |
| 6,586,902 B2 | * | 7/2003 | Gotou et al. | 318/560 |
| 6,600,287 B2 | * | 7/2003 | Gotou | 318/599 |
| 6,639,372 B2 | * | 10/2003 | Gotou | 318/254 |
| 6,759,821 B2 | * | 7/2004 | Gotou | 318/254 |

* cited by examiner

__PULSE GENERATING METHOD AND PULSE GENERATOR, AND MOTOR CONTROL SYSTEM USING THE SAME__

CROSS-REFERENCE TO RELATED APPLICATIONS

This application claims the benefit of Korean Patent Application No. 2004-35161, filed on May 18, 2004, in the Korean Intellectual Property Office, the disclosure of which is incorporated herein by reference.

BACKGROUND OF THE INVENTION

1. Field of the Invention

The present invention relates to a method of generating a pulse, a pulse generator employing the method, and a motor control system using the pulse generator, and more particularly, to a pulse generating method and a pulse generator which outputs a total number of pulse to be generated during a given period of time, and a motor control system employing the pulse generator and the pulse generating method.

2. Description of the Related Art

In general, a motor control system comprises a motor, a motor driver driving the motor, and a high level controller outputting a pulse to the motor driver based on a given program. Here, a motor driver controls a speed of the motor according to the pulse outputted from the high level controller.

The high level controller is equipped with a reference clock generator generating a reference clock, and determines a width of the outputted pulse based on the number of the reference clocks generated from the reference clock generator.

Figure 1:
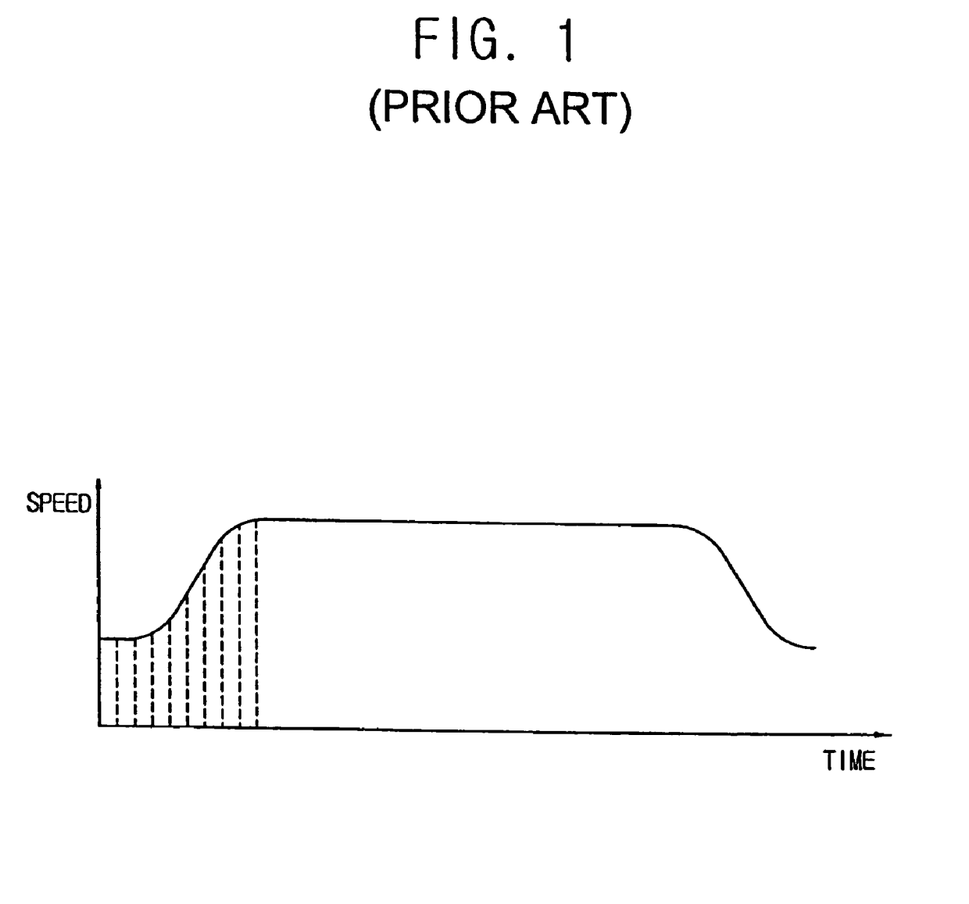
FIG. 1 is a graph illustrating a motor speed of a conventional motor control system.

In such a conventional motor control system, the high level controller commonly generates pulses based on information on the speed of the motor. For example, FIG. 1 illustrates the speed of the motor per hour. Here, the high level controller generates the pulses for the speed of the motor at regular interval. The motor driver controls the speed or a position of the motor based on the width or the number of the pulses generated from the high level controller.

Here, the conventional motor control system determines the width and the number of the pulses for the speed of the motor as follows.

At first, the regular interval, in other words, a cycle is "T", and a total number of pulses generated during the cycle (hereinafter refer to "T") is "k." Here, the width of each pulse generated from the high level controller becomes T/k. To generate k number of pulses having a width of T/k during T, a frequency of the reference clock of the high level controller should be relatively high. In this case, the high level controller needs high quality components, such as an integrated circuit, and accordingly a manufacturing cost for the motor control system is increased.

Meanwhile, if the frequency of the reference clock generated from the reference clock generator is not high enough for the high level controller to generate the k number of pulses having the width of T/k during T, an actual speed and position of the motor may differ from an expected speed and position according to input values of the motor control system.

SUMMARY OF THE INVENTION

In order to solve the foregoing and/or other problems, it is an aspect of the present general inventive concept to provide a pulse generating method and a pulse generator which outputs a total number of pulses to be generated during a given period of time, and a motor control system employing the pulse generator and the pulse generating method.

Additional aspects and advantages of the present general inventive concept will be set forth in part in the description which follows and, in part, will be obvious from the description, or may be learned by practice of the general inventive concept.

The foregoing and/or other aspects of the present general inventive concept may be achieved by providing a method of generating one or more pulses, the method comprising setting a cycle based on a frequency of one or more reference clocks, determining a total number of the pulses to be generated during the cycle, calculating the number of one or more first reference clocks used to determine a width of each of one or more first pulses, the number of one or more second reference clocks used to determine a width of each of one or more second pulses, a first pulse number for the first pulses and a second pulse number for the second pulses on the basis of the cycle and the total number of the pulses, and generating the first pulse number of the first pulses and the second pulse number of the second pulses during the cycle.

According to of the present general inventive concept, if the cycle and the total number of the pulses to be generated during the cycle satisfy a formula T/k=n+a (here, T is the cycle, k is the total number of the pulses to be generated during the cycle, n is an integer, and a is a decimal), the number of the first reference clocks determining the width of each first pulse is n, the number of the second reference clocks determining the width of each second pulse is n+1, the first pulse number is k×(1−a), and the second pulse number is a×k.

According to another aspect of the present general inventive concept, the cycle is calculated by multiplying a given time interval and clock frequencies of the reference clocks.

According to yet another aspect of the present general inventive concept, the generating of the first pulse number of the first pulses and the second pulse number of the second pulses during the cycle comprises sequentially generating the first pulse number of the first pulses, and sequentially generating the second pulse number of the second pulses.

According to still another aspect of the present general inventive concept, the generating of the first pulse number of the first pulses and the second pulse number of the second pulses during the cycle comprises detecting whether the first pulse number and the second pulse number are reducible, and alternately generating the first pulse and the second pulse according to a ratio of the first pulse number and the second pulse number if the first pulse number and the second pulse number are reducible.

According to another aspect of the present general inventive concept, the generating of the first pulse number of the first pulses and the second pulse number of the second pulses during the cycle comprises generating the reference clocks, counting the reference clocks, comparing a counted number of the reference clocks and the number of the first reference clocks determining the width of the first pulse, and generating the first pulses if the counted number of the reference clocks and the number of first reference clocks determining the width of the first pulse are identical.

According to another aspect of the present general inventive concept, the generating of the first pulse number of the first pulses and the second pulse number of the second pulses during the cycle comprises recounting the number of the reference clocks after initializing the counted number of the reference clocks, comparing the recounted number of the reference clocks and the number of the second reference clocks determining the width of the second pulse, and generating the second pulses if the recounted number of the reference clocks and the number of the second reference clocks determining the width of the second pulse are identical.

The foregoing and/or other aspects of the present general inventive concept may also be achieved by providing a pulse generator that comprises a control calculator to calculate the number of first and second reference clocks respectively determining widths of each of first pulses and each of second pulses, a first pulse number for the first pulses, a second pulse number for the second pulses according to a cycle based on a reference clock frequency of reference clocks and a total number of pulses to be generated during the cycle, and a logical circuit to receive the cycle, the total number of the pulses to be generated during the cycle, the number of the first reference clocks used to determine the width of the first pulse, the number of second reference clocks used to determine the width of the second pulse, the first pulse number and the second pulse number, and to generate the first pulse number of the first pulses and the second pulse number of the second pulses.

According to an aspect of the present general inventive concept, the control calculator provides the first pulse and the second pulse according to a ratio of the first pulse number and the second pulse number to the logical circuit if the first pulse number and the second pulse number are reducible, and the logical circuits alternately generates the first pulse and the second pulse according to the ratio of the first pulse number and the second pulse number during the cycle.

According to another aspect of the present general inventive concept, the logical circuit comprises a register to store the total number of pulses, the total number of the first and second reference clocks respectively determining the widths of the first pulse and the second pulse, the first pulse number and the second pulse number, a clock generator to generate the reference clocks, a clock counter counting the reference clocks generated from the reference clock generator, a comparator to generate an according signal if the counted value of the clock counter is identical with a value selected from the number of the first reference clocks for the first pulse and the number of the second reference clocks for the second pulse, and a pulse generating unit to generate the pulses for the number of the selected first or second reference clocks corresponding to one of the first pulse and the second pulse based on the according signal from the comparator.

According to yet another aspect of the present general inventive concept, the logical circuit further comprises a pulse counter to count the number of the pulses generated from the pulse generator, and the comparator selects one of the number of the first reference clocks for the first pulse and the number of the second reference clock for the second pulse to be compared with the counted value of the clock counter on the basis of a counting result of the pulse counter.

The foregoing and/or other aspects of the present general inventive concept may also be achieved by providing a motor control system that comprises a motor, a motor driver to drive the motor, and a pulse generator which outputs pulses to the motor driver to control a speed of the motor and comprises a control calculator to calculate the number of first and second reference clocks respectively determining widths of each of first pulses and each of second pulses, a first pulse number for the first pulses, a second pulse number for the second pulses according to a cycle based on a reference clock frequency, and a total number of pulses to be generated during the cycle, and a logical circuit to receive the cycle, the total number of the pulses to be generated during the cycle, the first reference clocks determining the width of the first pulse, the second reference clocks determining the width of the second pulse, the first pulse number and the second pulse number, and to generate the first pulse number of the first pulses and the second pulse number of the second pulses.

BRIEF DESCRIPTION OF THE DRAWINGS

These and other aspects and advantages of the present invention will become apparent and more readily appreciated from the following description of the embodiments, taken in conjunction with the accompany drawings of which.

DETAILED DESCRIPTION OF THE PREFERRED EMBODIMENTS

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 2:
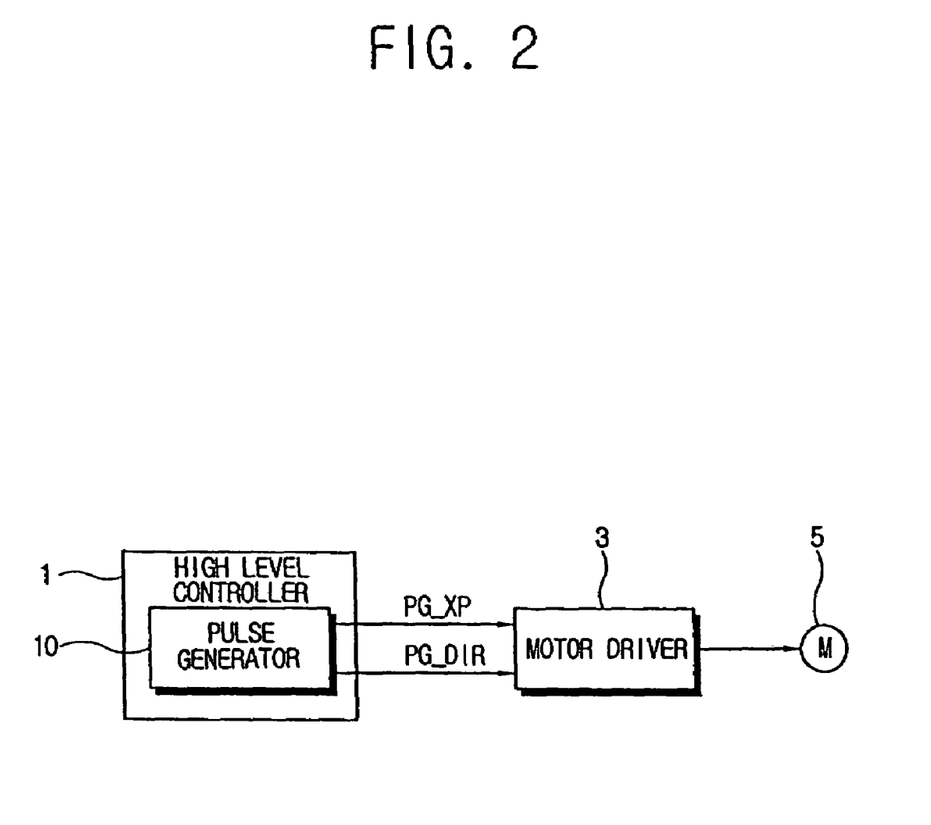
FIG. 2 is a control block diagram of a motor control system according to an embodiment of the present general inventive concept.

FIG. 2 is a control block diagram of a motor control system according to an embodiment of the present general inventive concept. As shown in FIG. 2, the motor control system can comprise a motor 5, a motor driver 3 to drive the motor 5 by turning on/off an electronic current supplied to a wire (not shown) winding in the motor 5, and a high level controller 1 to provide a command signal to the motor driver 3 to control a speed of the motor 5. Here, the command signal generated from the high level controller 1 can include a pulse (PG_XP) to control the speed of the motor 5 and a direction signal (PG_DIR) containing information on a rotation (or movement, hereinafter, rotation and movement mean the same) direction of the motor 5. Here, the command signal generated from the high level controller 1 can be outputted from a pulse generator 10 provided in the high level controller 1.

Figure 3:
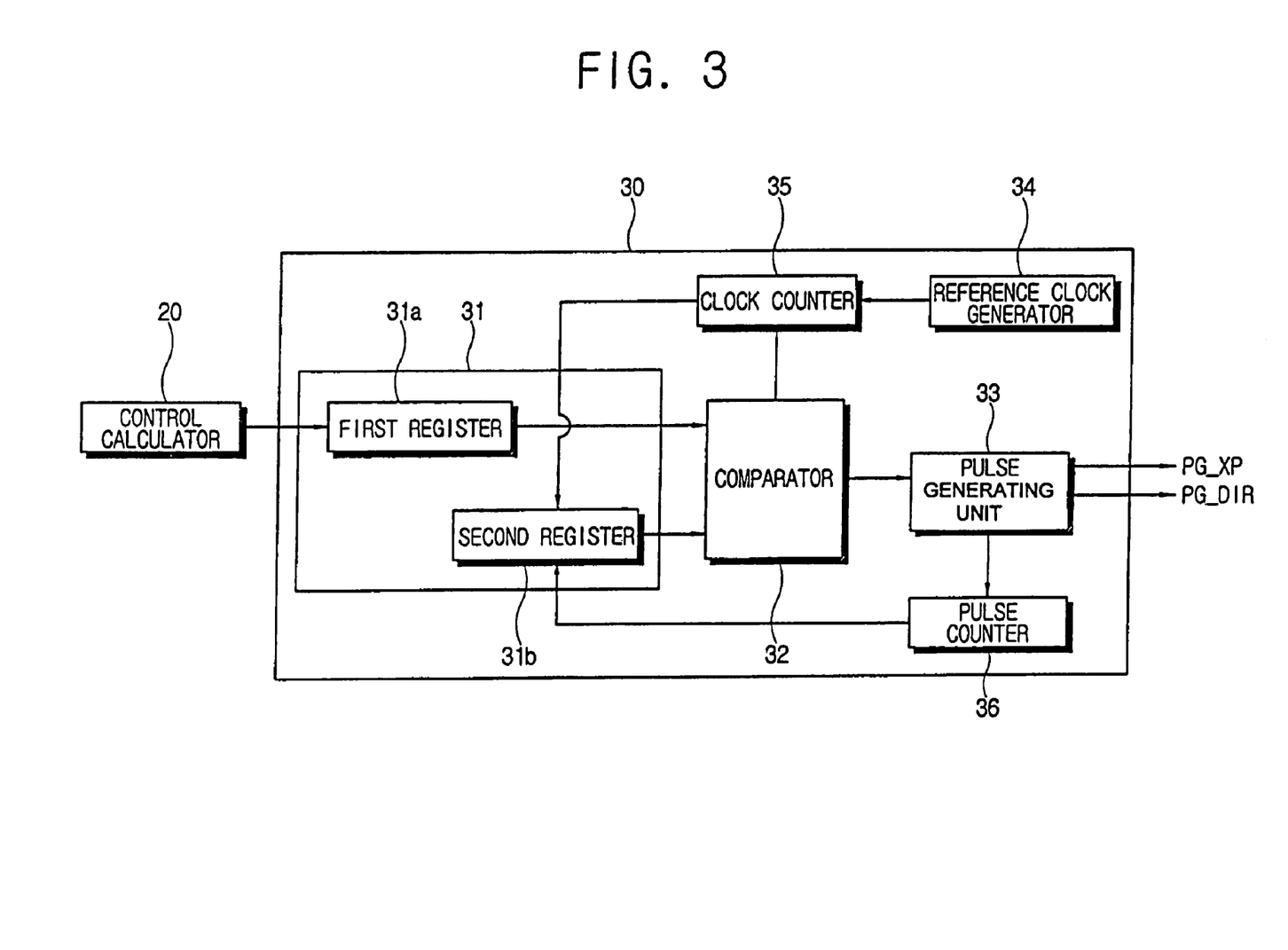
FIG. 3 is a control block diagram of a pulse generator according to another embodiment of the present general inventive concept.

FIG. 3 is a control block diagram of the pulse generator 10 of FIG. 2 according to another embodiment of the present general inventive concept. As shown in FIG. 3, the pulse generator 10 can comprise a control calculator 20 to calculate a high level command at regular intervals or in every cycles by employing a given program, and a logical circuit 30 to generate a pulse (PG_XP) or a direction signal (PG_DIR) based on the high level command outputted from the control calculator 20 and to provide the pulse (PG_XP) and the direction signal (PG_DIR) to the motor 3. Here, between the control calculator 20 and the logical circuit 30 may be provided with a data bus, an address bus, a read/write signal cable reading or loading given data, and a reset signal cable for initialization.

The high level command according to this embodiment, can contain information on a total number of pulses to be generated during a given cycle, the number of one or more first reference clocks used to determine a width of each of one or more first pulses, the number of one or more second reference clocks used to determine a width of each of one or more second pulses, a first pulse number for the first pulses, and a second pulse number for the second pulses. The total number of the pulses can be a sum of the number of the first pulses and the number of the second pulses.

Here, the control calculator 20 can calculate total information on one cycle based on a frequency of reference clocks. For example, the motor control system can control the speed of the motor 5 at regular interval t, and the frequency of the reference clocks is f. In this case, the control calculator 20 calculates a cycle T using the following [Formula 1].

$$T = t \times f \quad \text{[Formula 1]}$$

For example, the motor control system can control the speed of the motor 5 every 50 μm and the total number of frequencies of the reference clocks is 30 MHz, the cycle T becomes 1500.

Next, if the total number of the pulses to be generated during the cycle T is k, the control calculator 20 can output the total numbers of the first and second reference clocks respectively determining the width of the first pulse and the width of the second pulse, the first pulse number for first pulse and the second pulse number for the second pulse using the following [Formula 2].

$$T/k = n + a \ (n \text{ is an integer}, 0 \leq a < 1) \quad \text{[Formula 2]}$$

According to [Formula 2], the number of the first reference clocks determining the width of the first pulse is n, the number of the second reference clocks determining the width of the second pulse is n+1, the first pulse number for the first pulse is $k \times (1-a)$, and the second pulse number for the second pulse is $a \times k$.

With the same manner described above, the control calculator 20 can provide the logical circuit 30 with the total number of the pulses to be generated during the cycle T, the number of the first reference clocks determining the width of the first pulse, the number of the second reference clocks determining the width of the second pulse, the first pulse number for the first pulses, and the second pulse number for the second pulses.

Meanwhile, the logical circuit 30 according to the embodiment can generate the first pulse number for the first pulses and the second pulse number for the second pulse during the cycle T based on the high level command from the control calculator 20, and can provide the first and/or second pulses to the motor driver 3. Further, the logical circuit 30 can decide a rotation direction in which the motor 5 rotates according to a signal about the total number of the pulse outputted from the control calculator 20, and can output the corresponding direction signal (PG_DIR) to the motor driver 3.

The logical circuit 30 according to the embodiment may comprises a register 31 to store the high level command containing the total number of the pulses, the number of the first reference clocks for the first pulse, the number of the second reference clocks for the second pulse, the first pulse number and the second pulse number.

Further, the logical circuit 30 may comprise a reference clock generator 34 to generate the reference clocks, a clock counter 35 counting the generated reference clocks, a comparator 32 to compare various parameters applied to output the pulse (PG_XP), and a pulse generating unit 33 to generate the pulse (PG_XP) based on an according signal generated from the comparator 32.

The reference clock generator 34 can generate the reference clocks having a predetermined number of frequencies. The clock counter 35 can count a total number of the reference clocks generated from the reference clock generator 34.

The comparator 32 can compare the total number of the reference clocks counted by the clock counter 35 and the number of the first reference clocks for the first pulse or the number of the second reference clocks for the second pulse, and can output the according signal if the total number of the reference clocks generated during the cycle and the number of the first reference clocks for the first pulse are identical or the total number of the reference clocks generated during the cycle and the number of the second reference clocks for the second pulse are identical. Here, the pulse generating unit 33 can generate the first pulse and/or the second pulse according to the according signal outputted from the comparator 32.

Meanwhile, the logical circuit 30 according to the embodiment may comprise a pulse counter 36 to count the number of pulses (PG_XP) generated by the pulse generating unit 33. Here, the comparator 32 can select the number of the first reference clocks for the first pulse or the number of the second reference clocks for the second pulse to be compared with a counting value of the clock counter 35 according to the counting value of the pulse counter 36. It will be described in detail later.

Figure 4:
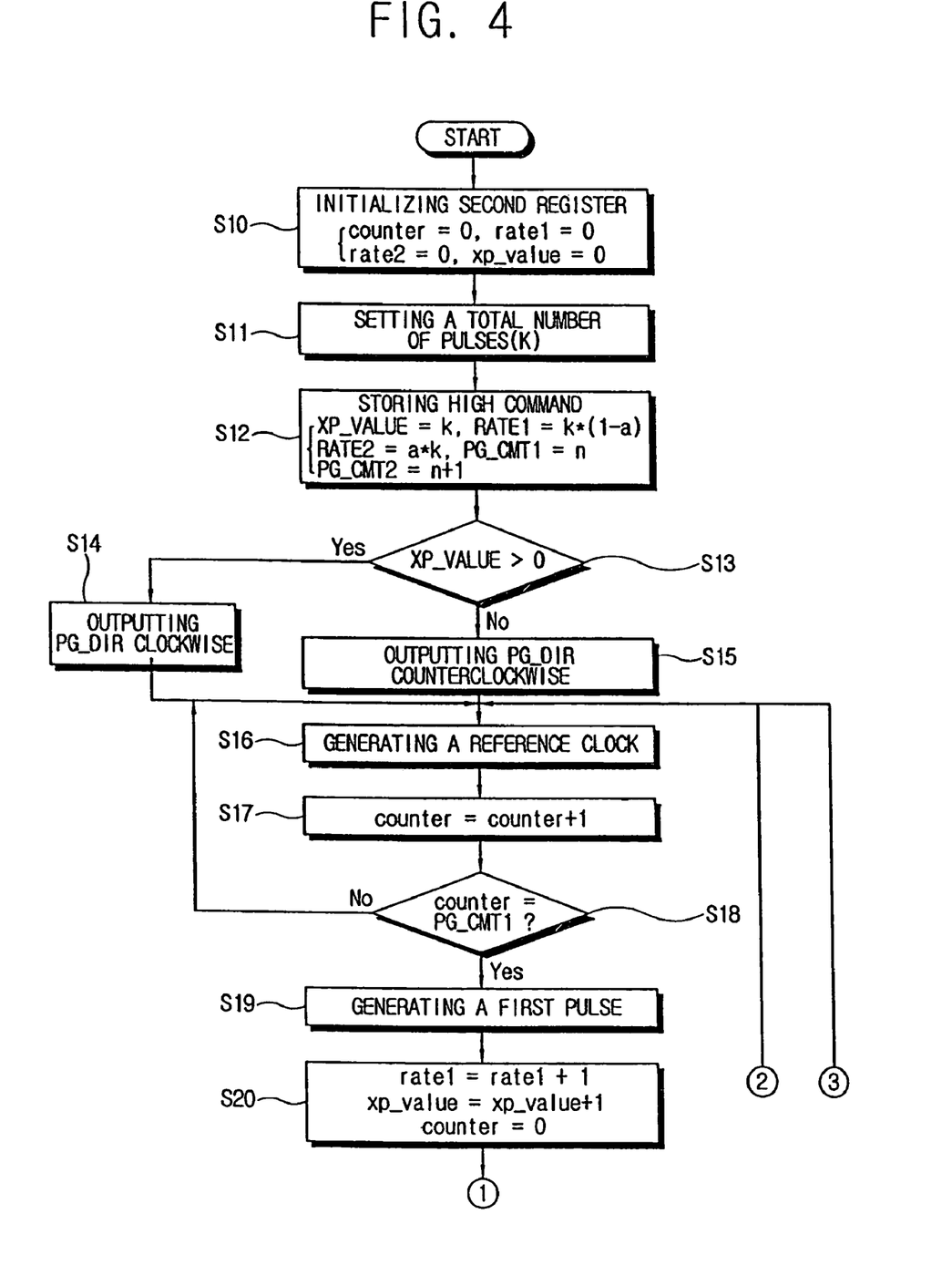
FIGS. 4 and 5 are flow charts showing a pulse generating method according to another embodiment of the present general inventive concept.
Figure 5:
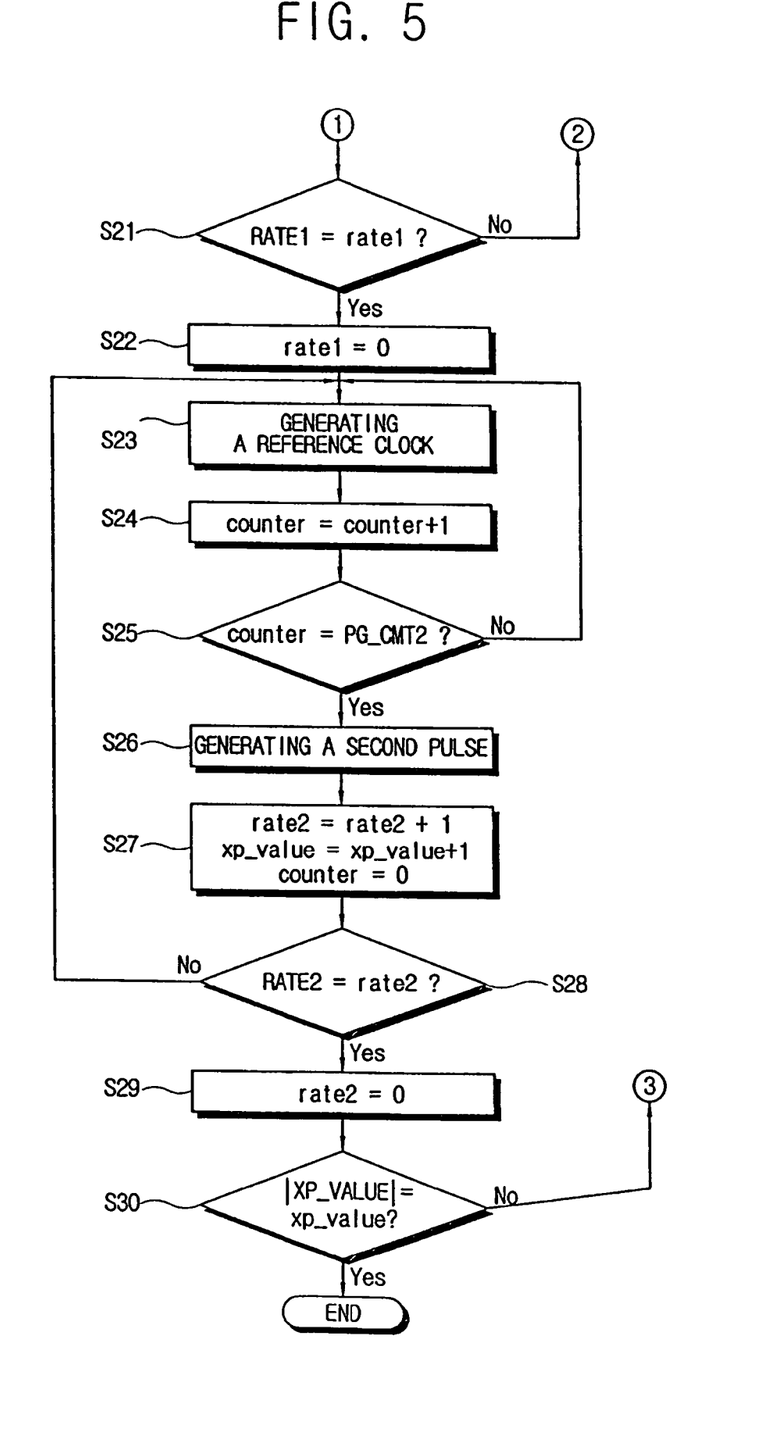

The logical circuit 30 according to this embodiment can store the various parameters, such as counting values of the clock counter 35 and the pulse counter 36, etc., applied during a pulse (PG_XP) generation method as shown in FIGS. 4 and 5. Here, the register 31, as shown in FIG. 3, may comprise a first register 31a to store the high level command from the control calculator 20, and a second register 31b to store the various parameters applied to the pulse (PG_XP) generation method.

With the above configuration of the motor control system, the pulse generation method will be described in detail hereinafter with reference to FIGS. 2 through 5. Here, the parameters for the high level command are the same as [Formula 1] and [Formula 2].

<High Level Command>
k: number of pulses to be generated during one cycle
n: number of first reference clocks for a width of the first pulse
n+1: number of second reference clocks for the width of the second pulse
$k \times (1-a)$: first pulse number for the first pulses
$a \times k$: second pulse number for the second pulses <Parameters for the First Register 31a>
XP_VALUE=k
RATE1=$k \times (1-a)$
RATE2=$a \times k$ PG_CMT1=n
PG_CMT2=n+1

<Parameters for the Second Register 31b> xp_value: total number counted by the pulse counter 36
counter: total number counted by the clock counter 35
rate1: value counted by the pulse counter 36 and compared with RATE1
rate2: value counted by the pulse counter 36 and compared with RATE2

At first, if one cycle "T" starts, for example, if a start signal is inputted to the logical circuit 30 (refer to "start" in FIGS. 6 and 7), the parameters (xp_value, counter, rate1 and rate2) stored in the second register 31b can be initialized in operation S10.

At the same time, if the number of the pulses k to be generated during the cycle T is set in operation S11, the control calculator 20 can calculate the parameters (a×k, k×(1−a), n, and n+1) and can provide the result of calculation to the logical circuit 30. The values of k, k×(1−a), a×k, n, and n+1 calculated by the control calculator 20 can respectively be stored as values of XP_VALUE, RATE1, RATE2, PG_CMT1, and PG_CMT2 in the first register 31a in operation S12.

Meanwhile, if the cycle T starts as the start signal is inputted, the logical circuit 30 can detect the rotation direction of the motor 5 by checking a sign (signal) based on the value of XP_VALUE in operation S13. Accordingly, the logical circuit 30 can generate a logical value of the direction signal (PG_DIR) outputted from the pulse generating unit 33 using the sign based on the value of XP_VALUE, and the rotation direction of the motor 5 can be determined. According to this embodiment, if the value of XP_VALUE is a positive number, the logical circuit 30 can generate the logical value of the direction signal (PG_DIR) to control the motor 5 to rotate clockwise (CW) in operation S14. If the value of XP_VALUE is a negative number, the logical circuit 30 can generate the logical value of the direction signal (PG_DIR) to control the motor 5 to rotate counter-clockwise (CCW) in operation S15.

Meanwhile, the reference clocks can be generated from the reference clock generator 34 in accordance with the start signal in operation S16. Accordingly, the clock counter 35 can count the reference clocks while incrementing a value of the counter in the second register 31b by one in operation S17.

Then, the comparator 32 can determine whether the value of the counter of the second register 31b and the value of PG_CMT1 of the first register 31a are the same when the value of the counter of the second register 31b is incremented by one in operation S18. Here, if the value of the counter of the second register 31b and the value of PG_CMT1 of the first register 31a are not the same, operations S16 and S17 are repeated. If the comparator 32 detects that the value of the counter of the second register 31b and the value of PG_CMT1 of the first register 31a are the same, the comparator 32 can generate the according signal.

Here, the pulse generating unit 33 can generate the pulse (PG_XP) based on the according signal from the comparator 32 in operation S19. This pulse (PG_XP) generated from the pulse generating unit 33 can be the first pulse having the width corresponding to an n number of the reference clocks.

Whenever the pulse generating unit 33 generates the first pulses, the pulse counter 36 can count the first pulses while respectively incrementing the values of the rate1 and xp_value of the second register 31b by one in operation S20. Here, the counter of the second register 31b can be initialized in operation S20.

Next, the comparator 32 can determine whether the value of the rate1 of the second register 31b and the value of RATE1 of the first register 31a are the same in operation S21. If these two values are not the same, operations S16 through S20 are repeated. If these two values are the same, the value of the rate1 of the first register 31a can be initialized in operation S22, and the first pulse is not generated.

Meanwhile, the reference clock generator 34 can generate the reference clocks in operation S23, and the clock count 35 can count the reference clocks and increments the value of the counter of the second register 31b by one in operation S24 when no first pulse is generated.

Then, the comparator 32 can determine whether the value of the counter of the second register 31b and the value of PG_CMT2 of the first register 31a are the same when the value of the counter of the second register 31b is incremented by one in operation S25. Here, if the value of the counter of the second register 31b and the value of PG_CMT2 of the first register 31a are not the same, operations S23 and S24 are repeated. If the comparator 32 detects that the value of the counter of the second register 31b and the value of PG_CMT2 of the first register 31a are the same, the comparator 32 can generate the according signal.

Here, the pulse generating unit 33 can generate the pulse (PG_XP) based on the according signal from the comparator 32 in operation S26. This pulse (PG_XP) generated from the pulse generating unit 33 is the second pulse having the width corresponding to an n+1 number of the reference clocks.

Then, the comparator 32 can compare the value of the rate2 of the second register 31b and the value of the RATE2 of the first register 31a in operation S21. Here, if the value of the rate2 of the second register 31b and the value of the RATE2 of the first register 31a are not the same, operations S23 through S27 are repeated. Otherwise, the rate2 of the first register 31a is initialized in operation S29, and the second pulse is not generated.

Next, the comparator 32 can compare an absolute value of the XP_VALUE of the first register 31a and the value of xp_value of the second register 31b in operation S30. Here, if the absolute value of the XP_VALUE and the value of the xp_value are not the same, operations S16 through S29 are repeated. Otherwise, the pulse (PG_XP) generated during the cycle T is not generated.

Meanwhile, the control calculator 20 according to this embodiment can determine whether the first pulse number for the first pulses and the second pulse number for the second pulses are reducible. Here, if the first pulse number and the second pulse number are reducible, the first pulse number and the second pulse number can be respectively outputted as k×(1−a) and a×k to the logical circuit 30.

For example, if T is 1500, and k is 200, 'n' becomes 7 and 'a' becomes 0.5. Accordingly, one hundred of the first pulses each having the width of seven reference clocks can be generated, and one hundred of the second pulses each having the width of eight reference clocks can be generated. Here, the control calculator 20 may output the first pulse number and the second pulse number not by the value of 100 but by a ratio of the first pulse number and the second pulse number, which becomes 1:1, and preferably but necessarily output a most simplified ratio to the logical circuit 30. Accordingly, the control calculator 20 can output 1 as the first pulse number and 1 as the second pulse number according to the ratio to the logical circuit 30, and the respective values stored in the RATE1 and RATE2 of the first register 31a become 1.

Figure 6:
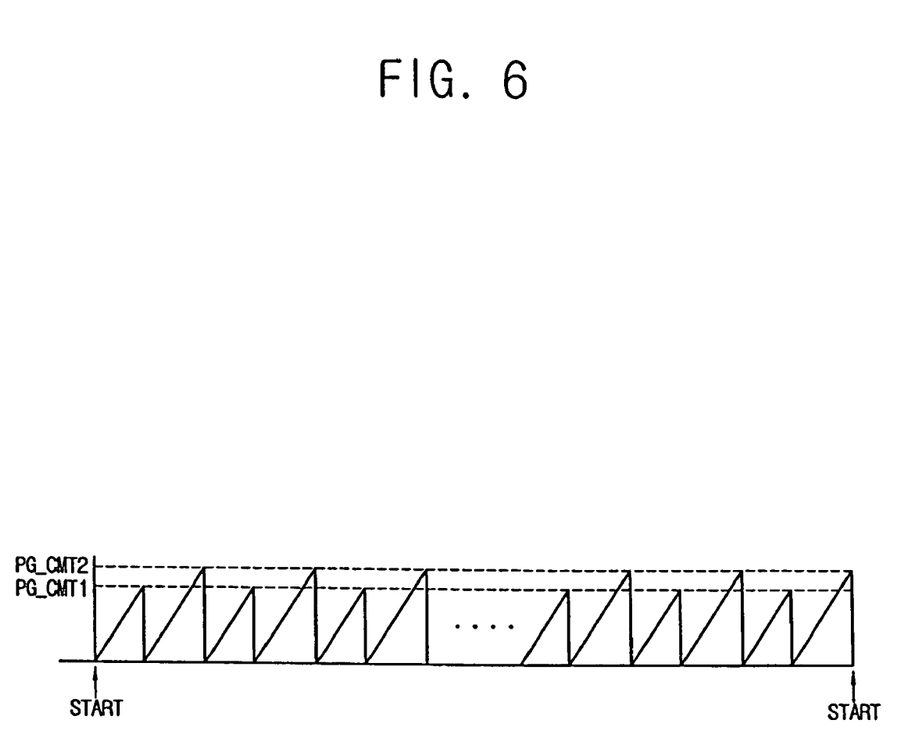
FIGS. 6 and 7 are waveforms generated from the pulse generator of FIG. 3.

FIG. 6 illustrates a waveform of the pulse (PG_XP) generated during the cycle T from the logical circuit 30 according to the foregoing process. As shown in FIG. 6, the logical circuit 30 can alternatively output the first pulse and the second pulse according to the ratio (herein, 1:1 according to the foregoing example). Although the logical circuit 30 can alternatively generate the first pulse and the second pulse, the total number of the pulses generated during the cycle T can be in accordance with the absolute value of the XP_VALUE because the total number of the pulses generated during the cycle T is determined in operation S30.

Meanwhile, the control calculator 20 according to another embodiment of the present invention can provide k×(1−a) and a×k calculated using [Formula 1] and [Formula 2] to the logical circuit 30, without considering the reduction between the first pulse number of the first pulses and the second pulse number of the second pulses. Accordingly, the pulse (PG_XP) generated by the pulse generating unit 33 of the logical circuit 30 can sequentially generate a k×(1−a) number of first pulses and an a×k number of the second pulses, as shown in FIG. 7.

Here, if the pulse generating unit 33 sequentially generates the first pulse and the second pulse, no corresponding value may be assigned to the parameter xp_value of the second register 31b in the logical circuit 30. In other words, if the pulse generating unit 33 generates all of the first pulse and the second pulse, a total of the first pulses and the second pulses calculated using the [Formula 1] and [Formula 2] and the total number of the pulses k become identical. Therefore, the counting and storing of the xp_value while incrementing by 1 to the first register 31a in FIGS. 4 and 5 may be skipped, and operation S30 in FIG. 5 may also be skipped.

Figure 7:
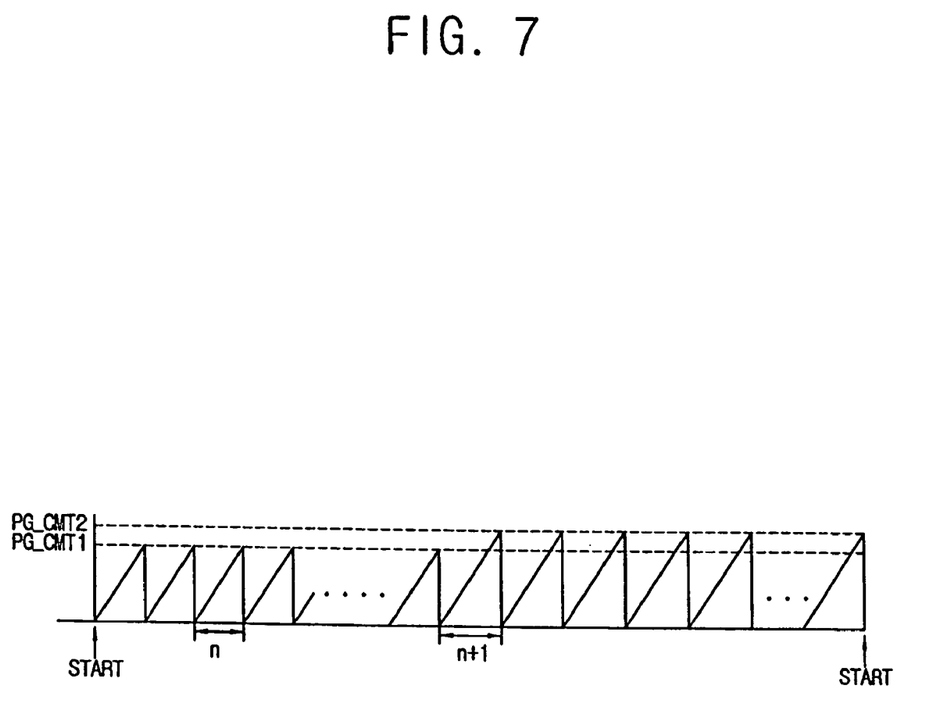

Here, it is preferable but not necessary that the waveforms of the pulse (PG_XP) in FIGS. 6 and 7 are selectively applied depending on a current state of the motor 5. For example, the waveform of the pulse (PG_XP) in FIG. 6 is adaptable when the motor 5 is in a uniform motion state or a slowly accelerated state whereas the waveform of the pulse (PG_XP) in FIG. 7 is adaptable when the motor 5 is rapidly accelerated or decelerated.

According to the foregoing embodiments, the pulse generating unit 33 sequentially generates the first pulse and the second pulse, but the generation sequence may be reversed as necessary. For example, the generation sequence of the first pulse and the second pulse may be reversed depending whether the motor is accelerated or decelerated.

Further, the logical circuit 30 according to the foregoing embodiments may employ a filed programmable gate array (FPGA), which is one of a programmable ROM and an application specific integrated circuit (ASIC). The logical circuit 30 may be realized by a very high speed integrated circuit (VHSIC) hardware description language (VHDL).

Accordingly, to generate the total number of pulses during one cycle, the present general inventive concept can provide setting a cycle based on a reference clock frequency, determining a total number of the pulses to be generated during one cycle, calculating, according to the cycle and the total number of the pulses, a total number of one or more first reference clocks used to determine a width of each of one or more first pulses, a total number of one or more second reference clocks used to determine a width of each of one or more second pulses, the first pulse number for the first pulses, and the second pulse number for the second pulses, and generating the first pulse number of the first pulses and the second pulse number of the second pulses during one cycle, thereby enhancing a control accuracy and reducing a manufacturing cost.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of generating one or more pulses to control a motor, comprising:
    setting a cycle based on a frequency of reference clocks and a predetermined time interval;
    determining a total number of one or more pulses to be generated during the cycle;
    calculating a number of one or more first reference clocks used to determine a width of each of one or more first pulses, a number of one or more second reference clocks used to determine a width of each of one or more second pulses, a first pulse number for the first pulses and a second pulse number for the second pulses on the basis of the cycle and the determined total number of the pulses; and
    generating the first pulse number of the first pulses and the second pulse number of the second pulses during the cycle according to the calculations.

2. The method according to claim 1, wherein if the cycle and the total number of the pulses to be generated during the cycle satisfy a formula T/k=n−a where T is the cycle, k is the total number of the pulses to be generated during the cycle, n is an integer, and a is a decimal, the number of the first reference clocks determining the width of the first pulse is n, the number of the second reference clocks determining the width of the second pulse is n+1, the first pulse number is k×(1−a), and the second pulse number is a×k.

3. The method according to claim 2, wherein the setting of the cycle comprises:
    calculating the cycle by multiplying a length of the predetermined time interval and the frequency of the reference clocks.

4. The method according to claim 3, wherein the generating of the first pulse number of the first pulses and the second pulse number of the second pulses during the cycle comprises sequentially generating the first pulse number of the first pulses, and sequentially generating the second pulse number of the second pulses.

5. The method according to claim 3, wherein the generating of the first pulse number of the first pulses and the second pulse number of the second pulses during the cycle comprises:
    detecting whether the first pulse number and the second pulse number are reducible; and
    alternately generating the first pulse and the second pulse according to a ratio of the first pulse number and the second pulse number if the first pulse number and the second pulse number are reducible.

6. The method according to claim 3, wherein the generating of the first pulse number of the first pulses and the second pulse number of the second pulses during the cycle comprises:
    generating the reference clocks;
    counting the reference clocks;
    comparing a counted number of the reference clocks and the number of the first reference clocks determining the width of the first pulse; and generating the first pulse if the counted number of the reference clocks and the number of first reference clocks determining the width of the first pulse are identical.

7. The method according to claim 6, wherein the generating of the first pulse number of the first pulses and the second pulse number of the second pulses during the cycle comprises:

recounting the number of the reference clocks after initializing the counted number of the reference clocks;

comparing the recounted number of the reference clocks and the number of the second reference clock determining the width of the second pulse; and generating the second pulse if the recounted number of the reference clocks and the number of the second reference clocks determining the width of the second pulse are identical.

8. A pulse generator to control a motor, comprising:

a control calculator to calculate a number of first and second reference clocks respectively used to determine widths of each of one or more first pulses and each of one or more second pulses, a first pulse number for the first pulses, and a second pulse number for the second pulses, and a total number of one or more pulses to be generated during a cycle based on a reference clock frequency of reference clocks and a predetermined time interval; and a logical circuit to receive the cycle and the calculations on the total number of the pulses to be generated during the cycle, the first reference clocks determining the width of the first pulse, the second reference clocks determining the width of the second pulse, the first pulse number, and the second pulse number, and to generate the first pulse number of the first pulses and the second pulse number of the second pulses during the cycle according to the calculations.

9. The pulse generator according to claim 8, wherein if the cycle and the total number of the pulses to be generated during the cycle satisfy a formula T/k=n+a where T is the cycle, k is the total number of pulse to be generated during the cycle, n is an integer, and a is a decimal, the number of the first reference clock determining the width of the first pulse is n, the number of the second reference clock determining the width of the second pulse is n+1, the first pulse number is k×(1−a), and the second pulse number is a×k.

10. The pulse generator according to claim 9, wherein the control calculator calculates the cycle by multiplying a length of the predetermined time interval and the frequency of the reference clocks.

11. The pulse generator according to claim 9, wherein the control calculator provides a ratio of the first pulse number and the second pulse number to the logical circuit if the first pulse number and the second pulse number are reducible, and the logical circuits alternately generates the first pulse and the second pulse according to the ratio of the first pulse number and the second pulse number during the cycle.

12. The pulse generator according to claim 11, wherein the logical circuit comprises:

a register to store the total number of the pulses, the number of the reference clocks respectively determining the widths of the first pulse and the second pulse, the first pulse number, and the second pulse number;

a clock generator to generate the reference clocks;

a clock counter to count the reference clocks generated from the reference clock generator;

a comparator to generate an according signal if the counted value of the clock counter is identical to a value selected from the number of the first reference clocks for the first pulse and the number of the second reference clocks for the second pulse; and a pulse generating unit to generate the pulses each having a width corresponding to the number of the selected first or second reference clocks based on the according signal from the comparator.

13. The pulse generator according to claim 12, wherein the logical circuit further comprises a pulse counter to count the number of the pulses generated from the pulse generating unit, and the comparator selects one of the number of the first reference clocks for the first pulse and the number of the second reference clocks for the second pulse to be compared to the counted value of the clock counter according to a counting result of the pulse counter.

14. The pulse generator according to claim 8, wherein the logical circuit comprises:

a register to store the total number of the pulses, the number of the first and second reference clocks respectively determining the widths of the first pulse and the second pulse, the first pulse number and the second pulse number;

a clock generator to generate the reference clocks;

a clock counter to count the reference clocks generated from the clock generator;

a comparator to generate an according signal if the counted value of the clock counter is identical to a value selected from the number of the first reference clocks for the first pulse and the number of the second reference clocks for the second pulse; and a pulse generating unit to generates the pulses each having a width corresponding to the number of the selected first or second reference clocks based on the according signal from the comparator.

15. The pulse generator according to claim 14, wherein the logical circuit further comprises a pulse counter to count the number of the pulses generated from the pulse generator, and the comparator selects one of the number of the first reference clocks for the first pulse and the number of the second reference clocks for the second pulse that is identical to a counting result of the clock counter according to a counting result of the pulse counter.

16. A motor control system, comprising:

a motor;

motor driver to drive the motor; and a pulse generator to generate one or more pulses to control a speed of the motor to the motor driver, wherein the pulse generator comprises, a control calculator to calculate a number of first and second reference clocks respectively determining widths of each of one or more first pulses and each of one or more second pulses, a first pulse number for the first pulse, a second pulse number for the second pulse, and a total number of one or more pulses to be generated during a cycle based on a frequency of reference clocks and a predetermined time interval, and a logical circuit to receive the cycle and the calculations on the total number of the pulses to be generated during the cycle, the number of the first reference clocks determining the width of the first pulse, the number of the second reference clocks determining the width of the second pulse, the first pulse number, and the second pulse number, and to generate the first pulse number of the first pulses and the second pulse number of the second pulses as the pulses during the cycle according to the calculations to control the motor.

17. The motor control system according to claim 16, wherein if the cycle and the total number of the pulses to be generated during the cycle satisfy a formula $T/k=n+a$ where T is the cycle, k is the total number of pulse to be generated during the cycle, n is an integer and a is a decimal, the number of the first reference clocks determining the width of the first pulse is n, the number of the second reference clocks determining the width of the second pulse is n+1, the first pulse number is $k\times(1\times a)$ and the second pulse number is $a\times k$.

18. The motor control system according to claim 17, wherein the control calculator calculates the cycle by multiplying a length of the predetermined time interval and the frequency of the reference clocks.

19. The motor control system according to claim 17, wherein the control calculator provides a ratio of the first pulse number and the second pulse number to the logical circuit if the first pulse number and the second pulse number are reducible, and the logical circuits alternately generates the first pulse and the second pulse according to the ratio of the first pulse number and the second pulse number during the cycle.

20. The motor control system according to claim 19, wherein the logical circuit comprises:
a register to store the total number of the pulses, the number of the first and second reference clocks respectively determining the widths of the first pulse and the second pulse, the first pulse number and the second pulse number;
a clock generator to generate the reference clocks;
a clock counter to count the reference clocks generated from the reference clock generator;
a comparator to generate an according signal if the counted value of the clock counter is identical to a value selected from the number of the first reference clocks for the first pulse and the number of the second reference clocks for the second pulse; and
a pulse generating unit to generate the pulses each corresponding to the number of the selected first or second reference clocks based on the according signal from the comparator.

21. The motor control system according to claim 20, wherein the logical circuit further comprises a pulse counter to count the number of the pulses generated from the pulse generator, and the comparator selects one of the number of the first reference clocks for the first pulse and the number of the second reference clocks for the second pulse to be compared to the counted value of the clock counter according to a counting result of the pulse counter.

22. The motor control system according to claim 16, wherein the logical circuit comprises:
a register to store the total number of the pulses, the number of the first and second reference clocks respectively determining the widths of the first pulse and the second pulse, the first pulse number and the second pulse number;
a clock generator to generate the reference clocks;
a clock counter to count the reference clocks generated from the clock generator;
a comparator to generate an according signal if the counted value of the clock counter is identical to a value selected from the number of the first reference clocks for the first pulse and the number of the second reference clocks for the second pulse; and
a pulse generating unit generate the pulses each having a width corresponding to the number of the selected first or second reference clocks based on the according signal from the comparator.

23. The motor control system according to claim 22, wherein the logical circuit further comprises a pulse counter to count the number of the pulses generated from the pulse generator, and the comparator selects one of the number of the first reference clocks for the first pulse and the number of the second reference clocks for the second pulse to be compared to a counting result of the clock counter according to a counting result of the pulse counter.

24. A pulse generator to control a motor, comprising:
a reference clock generator to generate one or more reference clocks;
a control calculator to generate a number of one or more first reference clocks, a number of one or more second reference clocks, a first pulse number of one or more first pulses, and a second pulse number of one or more second pulses, and a total number of pulses to be generated in a cycle based on a frequency of the reference clocks of the reference clock generator and a predetermined time interval; and
a logical circuit to generate the first pulses each having a first width according to the number of the first reference clocks of the control calculator and the number of the reference clocks of the reference clock generator, the second pulses each having a second width according to the number of the second reference clocks of the control calculator and the number of the reference clocks of the reference clocks, during the cycle according to the calculations so that a pulse train including the first pulses and the second pulses is generated according to the total number of the pulses and the reference clocks.

25. The pulse generator of claim 24, wherein the control circuit generates each of the first pulses when the number of the reference clocks generated from the reference clock generator is identical to the number of the first reference clocks.

26. The pulse generator of claim 25, wherein the control circuit generates each of the second pulses when the number of the reference clocks generated from the reference clock generator is identical to the number of the second reference clocks.

27. The pulse generator of claim 24, wherein the control circuit generates the first pulses and the second pulses such that the first pulse alternates with the second pulse.

28. A pulse generating method of generating a pulse to control a motor, the method comprising:
generating one or more reference clocks in a reference clock generator;
generating a number of one or more first reference clocks, a number of one or more second reference clocks, a first pulse number of one or more first pulses, and a second pulse number of one or more second pulses, and a total number of pulses to be generated in a cycle based on a frequency of the reference clocks of the reference clock generator and a predetermined time interval; and
generating the first pulses each having a first width according to the number of the first reference clocks and the number of the reference clocks, the second pulses each having a second width according to the number of the second reference clocks and the number of the reference clocks during the cycle according to the calculations, so that a pulse train including the first pulses and the second pulses is generated according to the total number of the pulses and the reference clocks.

29. A pulse generator, comprising:
a motor control unit to control a motor during a plurality of predetermined repeating regular time intervals of operation by generating a high level command including information indicating a plurality of first pulses having a first width to be generated in a next regular time interval of operation and indicating a plurality of second pulses having a second width to be generated during the next regular time interval of operation; and
a logic circuit to generate the pluralities of first and second pulses during the next predetermined regular time interval of operation according to the high level command received from the motor control unit,
wherein the first width of each of the plurality of first pulses is defined by a first number of reference clock cycles and the second width of each of the plurality of second pulses is defined by a second number of reference clock cycles.

30. The pulse generator of claim 29, wherein the first width is defined by a first number of reference clock cycles of a first reference clock having a first frequency and the second width is defined by a second number of reference clock cycles of a second reference clock having a second frequency that is different from the first frequency.

31. The pulse generator of claim 29, wherein the next predetermined regular time interval of operation consists of the plurality of first pulses and the plurality of second pulses.

* * * * *